United States Patent [19]

Erickson

[11] Patent Number: 4,535,565
[45] Date of Patent: Aug. 20, 1985

[54] GASKET FASTENER ARRANGEMENT

[75] Inventor: Lloyd A. Erickson, Park Ridge, Ill.

[73] Assignee: Illinois Tool Works Inc., Chicago, Ill.

[21] Appl. No.: 498,387

[22] Filed: May 26, 1983

[51] Int. Cl.³ .............................................. E06B 7/16
[52] U.S. Cl. ....................................... 49/493; 49/485; 49/498; 248/71
[58] Field of Search ................. 49/475, 485, 492, 493, 49/494, 498; 248/71; 411/508

[56] References Cited

U.S. PATENT DOCUMENTS 3,015,869  1/1962  Rapata ................................. 248/71

FOREIGN PATENT DOCUMENTS 916923  1/1963  United Kingdom .................. 248/71

*Primary Examiner*—Kenneth Downey
*Attorney, Agent, or Firm*—Thomas W. Buckman; John P. O'Brien

[57] ABSTRACT

A one-piece, integrally formed clip is provided for securing an elongate compressible gasket of given cross-sectional configuration to a panel having a clip-receiving aperture of predetermined peripheral dimensions. The clip comprises a bight portion dimensioned for receiving the gasket therewithin, a pair of resilient leg portions integrally joining the bight portion and normally extending outwardly therefrom in substantially parallel, spaced apart relation. The legs respectively terminate in substantially similar, oppositely outwardly diverging resilient barb portions. These barb portions diverge in the direction of the bight portion for resisting removal with respect to the through panel aperture. Additionally, the aperture defines a complimentary inner peripheral surface for non-removably receiving the clip. This surface is generally I-shaped, the central portion of the "I" being a lesser cross-sectional dimension than the width of the clip legs to prevent respective inward movement of the clip legs. The opposite end portions of the "I" are of similar cross-sectional dimension to the clip legs and of width less than the distance between the laterally outermost surface of each barb and the opposingly facing innermost surface of its associated leg, when in an undeformed condition, to permit ingress of the leg and barb but substantially oppose removal thereof.

8 Claims, 8 Drawing Figures

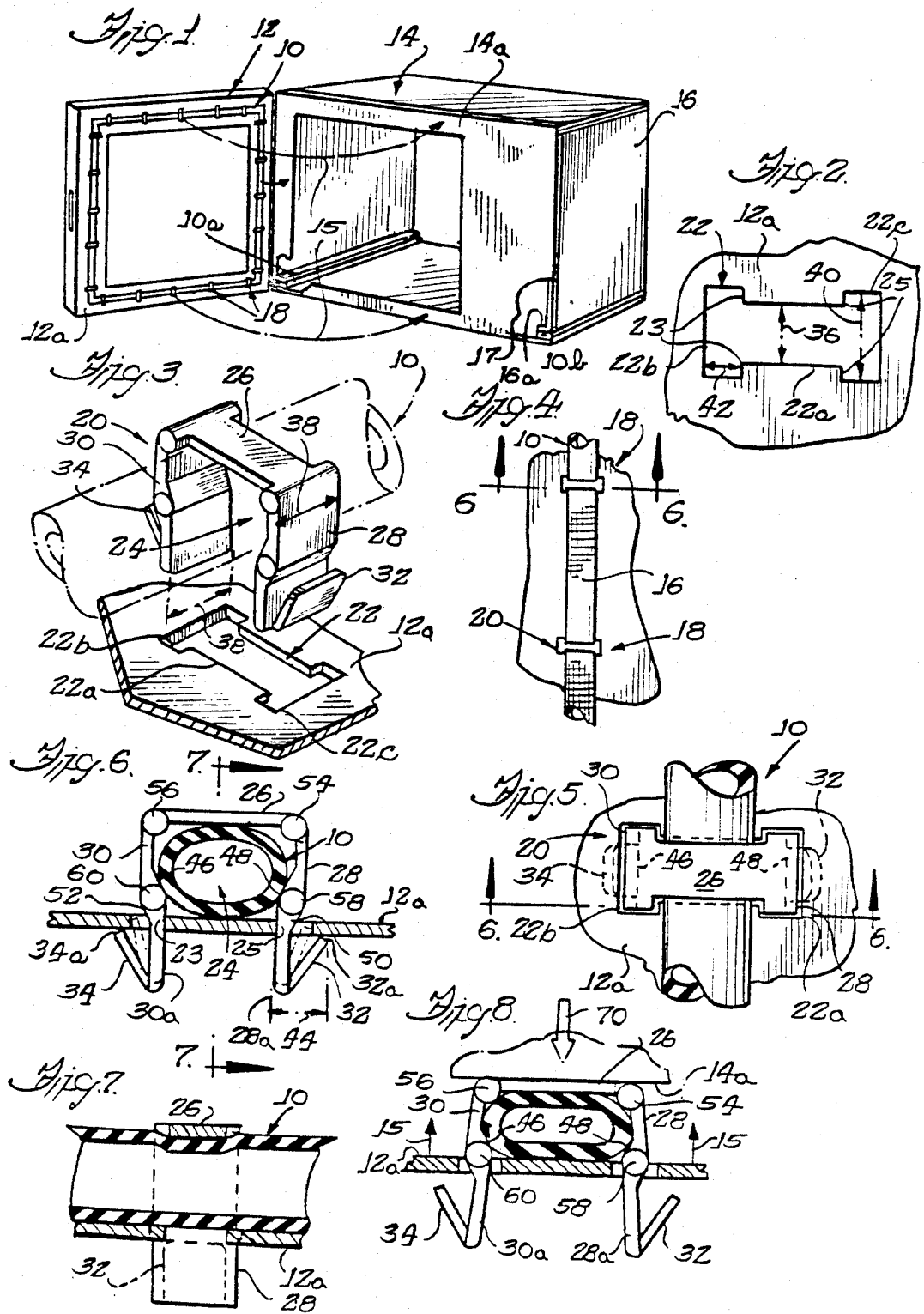

GASKET FASTENER ARRANGEMENT

BACKGROUND OF THE INVENTION

This application is directed generally to the fastener arts and more particularly to a novel and improved clip-type fastener for securing a gasket or the like to a panel. The invention is also directed to an arrangement comprising the clip-type fastener and a cooperating apertured panel for accepting such a fastener.

While the novel clip and cooperating apertured panel of the invention may find other utility, the disclosure will be facilitated by addressing gasket the problem of providing radio frequency (RF) shielding in electronic apparatus such as a computer. In this regard, the Federal Communications Commission (FCC) has established standards limiting the amount of radio frequency emission from various electronic apparatus such as computers, radio and television receiving and transmitting apparatus and the like.

Generally speaking, the prior art has attempted to solve such problems by providing an appropriately shielded metallic housing or casing for the apparatus in order to contain any RF waves which might be emitted from the apparatus. However, it will be appreciated that it is relatively difficult to provide a perfect and gap-free closure between the adjacent edge surfaces of the plates or panels making up such a housing. Additionally, many apparatus require various access panels, doors or the like on the housing to permit access to the apparatus inside for repair or the like. Accordingly, an appropriate RF shielding must also be provided for the adjacent surfaces of such an access panel or door and a facing surface of the housing. A gasket-like structure may be provided intermediate such surfaces to achieve RF shielding.

One type of gasket structure which may be utilized in such applications comprises a flexible metallic mesh shield member mounted to a suitable carrier. Preferably, the carrier comprises an elongate, tubular, cord-like, elastically compressible member and may be either circular or elliptical in cross-sectional configuration. The shield member preferably comprises a thin, flexible sleeve of a metallic mesh or an expanded metal, screen-like material surrounding the carrier. In operation, this structure provides intimate, metal-to-metal contact between the mesh-like sleeve and facing housing surfaces as the carrier is compressed between the housing surfaces.

In such installations, the fastener and cooperating panel aperture must secure the gasket in a non-removable manner with respect to the panel without crimping, crushing or otherwise substantially deforming the tubular gasket. It will be recognized that any substantial deformation in the area of the securing fastener or clip may result in small gaps or voids when the gasket is in operation, detracting from the desired shielding properties thereof. Moreover, such as fastener arrangement should be substantially non-removable, to prevent dislodgment of the gasket from its intended position, as such dislodgment or other misalignment may also cause a failure of the desired shielding action.

Additionally, it will be appreciated that such a fastener arrangement should preferably be relatively simple and inexpensive in its design and manufacture and moreover, capable of being assembled simply and quickly with the gasket and panel.

OBJECTS AND SUMMARY OF THE INVENTION

Accordingly, it is a general object of the invention to provide a novel and improved fastener arrangement for securing a gasket to a panel.

A more specific object is to provide a novel clip-like structure and cooperating apertured panel configuration for securing an elongate, cord-like gasket structure to the panel.

A further object is to provide a fastener arrangement in accordance with the foregoing objects which is capable of securing the gasket in a non-removable manner substantially without crushing or deforming any portion of the gasket.

A related object is to provide a fastener arrangement in accordance with the foregoing objects which is relatively simple and inexpensive and capable of simple and quick assembly with a gasket and panel.

Briefly, and in accordance with the foregoing objects, one aspect of the invention is directed to a one-piece, integrally formed clip for securing an elongate compressible gasket of given cross-sectional configuration to a panel having a clip-receiving aperture of predetermined peripheral dimensions. The clip comprises means defining a bight portion dimensioned for receiving said gasket therewithin, a pair of resilient leg portions integrally joining said bight portion and normally extending outwardly therefrom in substantially parallel, spaced apart relation, said legs respectively terminating in substantially similar, oppositely outwardly diverging resilient barb portions, said barb portions diverging in the direction of said bight portion for resisting removal with respect to said through panel aperture, thereby securing said gasket to said panel.

In accordance with a further aspect of the invention, an aperture defining a complimentary surface for non-removably receiving the clip is also provided. The surface defined by the through panel aperture is generally I-shaped, the central portion of the "I" being of lesser cross-sectional dimension than the width of the clip legs to prevent respective inward movement of the clip legs, and the opposite end legs of the "I" being of similar cross-sectional dimension to the clip legs and of width less than the distance between the laterally outermost surface of each barb and the opposingly facing innermost surface of its associated leg, when in an underformed condition, to permit ingress of the leg and barb but substantially oppose removal thereof.

BRIEF DESCRIPTION OF THE DRAWINGS

The foregoing, as well as other objects, features and advantages of the invention will be more readily appreciated upon reading the following detailed description of the illustrated embodiment, together with reference to the drawings, wherein:

FIG. 1 is a simplified perspective view of a housing for apparatus such as a computer in conjunction with which the gasket fastening arrangement of the invention is advantageously utilized;

FIG. 2 is a top plan view of an apertured panel surface defining an aperture periphery in accordance with a preferred form of the invention;

FIG. 3 is an enlarged perspective view illustrating the assembly of a gasket member with a panel utilizing the fastener arrangement of the invention;

FIG. 4 is a top plan view of a portion of a gasket secured to a panel utilizing a fastener arrangement in accordance with the invention;

FIG. 5 is an enlarged top plan view taken generally from the top of FIG. 4;

FIG. 6 is a sectional view taken generally in the plane of the line 6—6 of FIG. 5;

FIG. 7 is a view taken generally in the plane of the line 7—7 of FIG. 6; and

FIG. 8 is a sectional view, similar to FIG. 5, and further illustrating the assembled gakset and fastener arrangement in accordance with the invention subjected to a compressive force, as when the related door is in a closed condition.

DETAILED DESCRIPTION OF THE ILLUSTRATED EMBODIMENT

Referring now to the drawings, and initially to FIG. 1, the fastener arrangement of the invention will be described with reference to the problem of securing a gasket 10 to a door panel 12 of a housing 14. As previously mentioned, this housing 14 may comprise a suitable metallic housing to provide RF shielding for electronic apparatus such as a computer. In this regard, the housing may comprise a number of sheets or panels of metallic material 16, 17, etc. which may also have suitable similar gaskets 10a, 10b assembled intermediate their facing surfaces to ensure RF sheilding.

In this regard, a side panel 16 is provided with an inwardly directed flange portion 16a which may similarly receive a gasket 10 secured thereto for positive RF shielding in the region where the flange 16a is secured to a facing surface of a bottom panel 17. Accordingly, it will be understood that the ensuing discussion with reference to the door 12 contemplates and includes the foregoing use of the gasket securing arrangement of the invention as well.

In this regard, as best viewed in FIGS. 4 and 5, the gasket 10 comprises an elongate and preferably tubular member of rubber or similar elastomeric material. This gasket 10 is further surrounded by a tubular sleeve of a metallic mesh or an expanded metal, screen-like material 16. In the illustrated embodiment, the gasket 10 is elliptical in cross-section, as best seen in FIG. 5. The screen 16 has been eliminated from the showings in FIGS. 5-8 for clarity.

Accordingly, the gasket 10, as best viewed in FIG. 1, may be provided as a substantially continuous member about a given surface portion of an inner panel 12a of the door 12. A plurality of fastener arrangements in accordance with the invention, indicated generally by the reference numerals 18, are spaced apart at desired intervals for securing the gasket 10 to the surface of the panel 12a.

One such fastener arrangement 18 in accordance with the invention includes a novel clip, designated generally by the reference numeral 20. The invention also extends to the combination of this clip 20 with a novel cooperating through aperture 22 in the panel 12a.

Referring initially to the clip 20, a bight portion for receiving and holding the gasket 10 therewithin is indicated generally by the reference numeral 24. The bight portion is generally defined by an upper wall surface or strap portion 26 which is integrally joined at opposite ends thereof by a pair of downwardly depending leg portions 28 and 30. These leg portions 28 and 30 when in an undeformed condition extend generally in parallel spaced relationship from the strap 26. Advantageously, the clip 20 is preferably made from a suitable plastics material, whereby the parts thereof exhibit a degree of elasticity or flexibility for cooperating with the aperture 22 as will be presently seen.

The respective leg portions 28 and 30 extend at 28a and 30a beyond the bight portion 24 and terminate in substantially identical but oppositely outwardly diverging resilient barb portions 32 and 34. These barb portions 32 and 34 will be seen to diverge in a generally upward direction, or toward the bight portion 24 of the clip 20.

Referring briefly to FIG. 2, the cooperating panel aperture will be seen to be generally I-shaped in configuration. Preferably, the central portion 22a of this "I" defines a width 36 which is less than the width 38 of the respective legs 28 and 30. Hence, the legs 28 and 30 are substantially precluded from collapsing or otherwise extending to this central area 22a when the clip 20 is assembled with the aperture 22. The opposite end portions 22b and 22c of the I-shaped aperture 22 are generally of similar width 40 to the width 38 of the respective legs 28 and 30 of the clip 20.

While the aperture 22 may be formed as appropriately spaced portions 22b and 22c, the formation of intermediate portion 22a, defining a single aperture is preferred. Advantageously a single tool and operation may thus be utilized to form aperture 22, without any need for critical measurements or alignments as would be the case with separate tools for separate apertures 22b, 22c.

Moreover, the transverse dimension or dimension normal to the width 40, as indicated generally at 42, is selected to be somewhat less than the dimension defined across each of legs 28, 30 and the associated barb 32, 34 when in an undeformed state. That is, the dimension 42 across respective aperture portions 22b and 22c is somewhat less than the dimension 44 indicated in FIG. 6, between an outermost projection or surface of the barb 32 and the opposingly facing inner surface of its associated leg 28 at its extension 28a. Accordingly, the barbs and legs readily compress somewhat to allow ingress through aperture parts 22b and 22c, but thereafter resiliently return to resist removal thereof.

Additionally, the legs 28, 30, when compressed, will abut shoulders 23, 25 defined intermediate respective aperture portions 22a and 22b, 22a and 22c. This then prevents removal of the clip, since the dimension 44 across the barbs is greater than the dimension 42 across the aperture portions 22b and 22c.

In accordance with the foregoing, and as best viewed in FIG. 5, the clip 20 may thus be relatively simply and quickly fitted around the gasket 10. Thereupon, respective legs 28 and 30 and barbs 32 and 34 are aligned with the portions 22b and 22c of aperture 22. As indicated generally in phantom line in FIG. 5, the barbs and legs compress inwardly to allow ingress through respective aperture portions 22b and 22c. Immediately thereafter, the barbs 32 and 34 resiliently return to their undeformed condition. That is, barbs 32 and 34 substantially overlie rear portions of the panel 12a to either side of aperture 22 and preventing or resisting removal of the clip 20 therefrom.

Advantageously, as best seen in FIG. 7, the relatively thin cross-section and the narrow width of strap portion 26 minimize deformation of the gasket 10 upon its assembly with panel 12a as illustrated in FIG. 5. Moreover, upper or outer edges 32a, 34a of barbs are spaced from the inner surface of the strap 26 of the bight portion a sufficient distance to normally minimally compress the gasket 10 when the legs and barbs are engaged through the panel aperture 22. This enhances engagement of clip 20 with any of a plurality of panels such as panel 12 over a predetermined range of thickness.

That is, this minimal compression, as seen in FIGS. 6 and 8, advantageously enhances engagement of the clip 20 with aperture 22. In this regard, the slightly compressed gasket 10 tends to bear against and urge the bight portion 24 upwardly, assuring engagement of the ends 32a, 34a of the barbs with the reverse side of the panel 12 to either side of aperture 22.

Hence, the surface of gasket 10 is left substantially minimally deformed and capable of forming satisfactory with respect to opposing surface 14a of the housing 14 as shown in FIG. 1. Such shielding is also shown in FIG. 8, to which reference is also invited.

In the illustrated embodiment, the clip 20 further includes a pair of substantially identical and inwardly facing converging surfaces 46, 48 formed on portions of the respective legs 28 and 30 in opposing relation generally to the bight portion 24 of the clip 20. These surfaces 46 and 48 further encourage engagement with the outer surface of the tubular gasket 10. Moreover, these surfaces in contact with the gasket 10 further encourage outward spreading of the legs 28 and 30 during insertion of the clip with respect to panel aperture 22 as seen in FIG. 5 as well as driving closing of the door, as seen in FIG. 8. This spreading encourages the movement of respective barbs 32 and 34 respectively outwardly of the inner or rear surface of the panel at aperture portions 22b and 22c, to resist removal of the clip once inserted. Moreover, converging inner surfaces 46 and 48 encourage additional surface contact with and centering at the gasket 10.

In this regard, generally opposing outer surfaces of the legs 28 and 30 are also inwardly converging as indicated generally at 50 and 52, and this in turn results in lower portions 28a and 30a of the legs 28 and 30 extending respectively inwardly somewhat from the bight portion 24 of the clip 20. This provides suitable relief area for inward compression of the barbs 32 and 34 to facilitate insertion through the aperture 22 as shown in FIG. 5.

Additional corner strengthening pins or portions 54, 56 are provided intermediate the strap 26 and respective legs 28 and 30 where they join. These additional strengthening portions or pins are generally cylindrical in configuration in the illustrated embodiment. Moreover, referring briefly to FIG. 8, these portions 54 and 56 extend inwardly of the bight portion providing additional surface contact with and centering of the gasket 10 when the clip and gasket are compressed upon closing of the door 12. In the illustrated embodiment, the gasket 10 is elliptical in cross-section. Hence, the bight portion 24, together with surfaces 46, 48 and projections 54, 56 are arranged for optimal engagement with gasket 10.

Similarly, generally cylindrical strengthening pin-like portions 58 and 60 are preferably provided at the areas where the respective legs 28 and 30 converge inwardly somewhat as described above. These additional strengthening portions 58 and 60, as well as portions 54 and 56 further serve to prevent excessive flexing or deformation of the clip 20 in the regions of the bends or corners generally defined thereby. Rather, such bending and/or deformation is confined to the portions of the strap 26 and legs 28, 30 away from the corners and to the lower leg portions 28a and 30a and barbs 32 and 34. This facilitates both the assembly illustrated in FIG. 5 and the compression or sealing action illustrated in FIG. 8.

While the invention has been illustrated and described herein with reference to a preferred embodiment, the invention is not limited thereto. Those skilled in the art may devise various changes, alternatives and modifications upon reading the foregoing description. The invention includes such changes, alternatives and modifications insofar as they fall within the spirit and scope of the appended claims.

The invention is claimed as follows:

1. In combination, a one-piece, integrally formed clip for securing an elongate compressible gasket of given cross-sectional dimensions to a panel and a clip-receiving aperture in the panel, said clip comprising: means defining a bight portion dimensioned for receiving said elongate gasket therewithin; a pair of resilient leg portions integrally joining said bight portion and normally extending outwardly therefrom in substantially parallel, spaced apart relation; said legs respectively terminating in substantially similar, oppositely outwardly diverging resilient barb portions; said barb portions diverging generally in the direction of said bight portion for resisting removal with respect to said through panel aperture; said aperture comprising a single, continuous aperture including means for permitting ingress of said legs and associated barb portions therethrough but substantially resisting removal thereof; and said leg portions include a pair of complementary and similar inwardly converging surfaces spaced apart from said bight portion, whereby a compressive forced applied to said strap results in said compressible gasket urging said leg portions substantially mutually outwardly.

2. The combination in accordance with claim 1 wherein said gasket is substantially elliptical in cross-sectional configuration in its uncompressed state, and wherein said inwardly converging surfaces are symmetrical so as to provide additional surface contact therewith and encourage centering thereof with respect to said bight portion.

3. The combination in accordance with claim 2 and further including additional inwardly extending surfaces, intermediate respective ends of said strap and the respective legs, for further enhancing surface contact with said gasket and encouraging centering thereof with respect to said bight portion.

4. A one-piece, integrally fomred clip for securing an elongate compressible gasket of given cross-sectional dimensions to a surface of a panel having a clip-receiving aperture of predetermined configuration and dimensions, said clip comprising: means defining a strap; a pair of resilient leg portions integrally joining said strap and normally extending outwardly therefrom in substantially parallel spaced apart relation; said strap portion and said legs together defining a bight portion dimensioned for receiving a cross-sectional portion of said elongate compressible gasket therewithin; said legs respectively terminating in oppositely outwardly diverging resilient barb portions; said barb portions diverging in the direction of said bight portion for resisting removal with respect to said through aperture in said panel, thereby securing said elongate compressible gasket to said surface; and said leg portions include a pair of complementary and similar inwardly converging surfaces spaced apart from said bight portion, whereby a compressive force applied to said strap results in said compressible gasket urging said leg portions substantially mutually outwardly.

5. A clip according to claim 4 wherein said gasket is substantially elliptical in cross-sectional configuration in its uncompressed state, and wherein said inwardly converging surfaces are symmetrical so as to provide additional surface contact therewith and encourage centering thereof with respect to said bight portion.

6. A clip according to claim 5 and further including additional inwardly extending surfaces, intermediate respective ends of said strap and the respective legs, for further enhancing surface contact with said gasket and encouraging centering thereof with respect to said bight portion.

7. A one-piece, integrally formed clip for securing an elongate compressible gasket of given cross-sectional configuration to a panel having a clip-receiving aperture of predetermined peripheral dimensions, said clip comprising: means defining a bight portion dimensioned for receiving said gasket therewithin; a pair of resilient leg portions integrally joining said bight portion and normally extending outwardly therefrom in substantially parallel, spaced apart relation; said legs respectively terminating in substantially similar, oppositely outwardly diverging resilient barb portions; said barb portions diverging in the direction of said bight portion for resisting removal with respect to said through panel aperture, thereby securing said gasket to said panel; and said leg portions include a pair of complementary and similar inwardly converging surfaces spaced apart from said bight portion, whereby a compressive force applied to said bight portion causes said compressible gasket to urge said leg portions substantially mutually outwardly.

8. A clip according to claim 7 and further including additional inwardly extending surfaces, intermediate respective ends of said bight portion and the respective legs, for further enhancing surface contact with said gasket and encouraging centering thereof with respect to said bight portion.

* * * * *